US005895248A

United States Patent [19]

De Boer et al.

[11] Patent Number: 5,895,248
[45] Date of Patent: *Apr. 20, 1999

[54] MANUFACTURE OF A SEMICONDUCTOR DEVICE WITH SELECTIVELY DEPOSITED SEMICONDUCTOR ZONE

[75] Inventors: Wiebe B. De Boer; Matthias J.J. Theunissen, both of Eindhoven, Netherlands; Armand Pruijmboom, Albuquerque, N.M.

[73] Assignee: U.S. Philips Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/734,280

[22] Filed: Oct. 21, 1996

[30] Foreign Application Priority Data

Oct. 20, 1995 [EP] European Pat. Off. ............ 95202841

[51] Int. Cl.⁶ .................................................. H01L 21/205
[52] U.S. Cl. .......................... 438/341; 438/341; 438/503; 438/504; 438/795; 438/906; 438/DIG. 17
[58] Field of Search .............................. 437/225, 228, 437/233, 247; 438/341, 503, 504, 795, 906, DIG. 17

[56] References Cited

U.S. PATENT DOCUMENTS 4,292,343  9/1981  Plaettner et al. .................... 427/39
5,119,541  6/1992  Ohmi et al. ......................... 118/725
5,202,284  4/1993  Kamins et al. ...................... 438/942
5,326,718  7/1994  Klose et al. ........................ 437/89

FOREIGN PATENT DOCUMENTS

0430280a2  6/1991  European Pat. Off. .
2126104   12/1971  Germany ..................... B01J 17/40

OTHER PUBLICATIONS

"A Self-Aligned Selective MBE Technology For High-Performance Bipolar Transistors", by F. Sata et al., Proceedings IEEE, 1990, Section 25.7.1, pp. 1–4.

Primary Examiner—Charles Bowers
Assistant Examiner—Thanh Nguyen

[57] ABSTRACT

A method of a manufacturing a semiconductor device whereby a layer of insulating material and a layer of polycrystalline silicon are provided on a surface of a monocrystalline wafer. A window is then provided in the layer of polycrystalline silicon and a protective layer is formed on the wall of this window. Then the layer of insulating material is removed within the window and below an edge of the layer of polycrystalline silicon adjoining the window. Subsequently, silicon is selectively grown on the mono- and polycrystalline silicon exposed in and adjacent the window from a vapor comprising chlorine as well as silicon at low pressure. The silicon wafer is cleaned before the selective deposition through heating in an atmosphere comprising hydrogen at a pressure of at least 1 atmosphere. This cleaning safeguards that the deposited monocrystalline silicon will always be connected to the layer of polycrystalline silicon by the deposited polycrystalline silicon.

9 Claims, 2 Drawing Sheets

MANUFACTURE OF A SEMICONDUCTOR DEVICE WITH SELECTIVELY DEPOSITED SEMICONDUCTOR ZONE

BACKGROUND OF THE INVENTION

The invention relates to a method of manufacturing a semiconductor device whereby a layer of insulating material and a layer of polycrystalline silicon are provided on a surface of a monocrystalline silicon wafer, whereupon consecutively the layer of polycrystalline silicon is provided with a window, a protective layer is provided on the wall of said window, the layer of insulating material is removed from the surface of the silicon wafer within the window and below an edge of the layer of polycrystalline silicon adjoining the window, and silicon is selectively deposited from a vapor at reduced pressure on the monocrystalline and polycrystalline silicon exposed in and adjacent the window.

During the deposition of the silicon, this semiconductor material grows epitaxially in monocrystalline form on the exposed monocrystalline silicon and in polycrystalline form on the polycrystalline silicon exposed adjacent the window. The grown monocrystalline silicon forms a semiconductor zone which together with the monocrystalline silicon of the wafer forms a semiconductor junction. This semiconductor zone is connected to the layer of polycrystalline silicon situated adjacent the window by the grown polycrystalline silicon.

Since the selective deposition of silicon is carried out at a reduced pressure, a smooth layer of homogeneous thickness is obtained. The method may be used for forming semiconductor devices with sub-micron dimensions.

The method may be used, for example, for making a bipolar transistor with an emitter formed by polycrystalline silicon. Such a transistor is sometimes called "poly-emitter transistor". The grown monocrystalline silicon then forms the base of the transistor which is contacted by the grown polycrystalline silicon and the layer of polycrystalline silicon. The wafer forms the collector of the transistor. The grown monocrystalline silicon then forms the collector-base junction together with the wafer. After the selective deposition, a further layer of polycrystalline silicon is deposited which forms the emitter of the transistor. This further layer of polycrystalline silicon forms the base-emitter junction together with the layer of selectively deposited monocrystalline silicon in the window. Dopants required in the base and the emitter may be provided either after the deposition thereof or during the deposition thereof in the manufacture of the transistor. The wafer may be provided with the required dopant before the deposition of the layers of insulating material and polycrystalline silicon.

The method may also be used for making a MOS transistor. In that case a layer of gate dielectric is provided on the grown monocrystalline silicon within the window, for example by oxidation. Subsequently, a further layer of polycrystalline silicon is again deposited, in this case forming the gate electrode of the transistor.

A method of the kind mentioned in the opening paragraph is known from "A Self-Aligned Selective MBE Technology for High-Performance Bipolar Transistors", F. Sato et al., Proceedings IEEE, 1990, 25.7.1–4, whereby the silicon is selectively deposited from a vapor comprising disilane ($Si_2H_6$) at a pressure of $2\times10^{-5}$ torr and a temperature of 560° C.

The selective deposition of silicon is carried out at a very low pressure in the known method. When silicon is deposited from a vapor of disilane at a higher pressure, the process is non-selective and silicon is deposited also on the insulating layer. A very complicated and expensive equipment is necessary for carrying out a deposition at said low pressure.

SUMMARY OF THE INVENTION

The invention has for its object inter alia to provide a method which can be carried out with comparatively simple equipment.

According to the invention, the method is for this purpose characterized in that the silicon is deposited from a vapor which comprises chlorine as well as silicon, the silicon wafer being cleaned through heating in hydrogen at a pressure of at least 1 atmosphere before the selective deposition. Deposition processes in which silicon is deposited from a vapor comprising chlorine as well as silicon are selective at pressures much higher than the low pressure mentioned earlier. Preferably, the deposition is carried out at a pressure in the range from 1 to 100 torr, the wafer being heated to a temperature lying in a range from 600 to 800° C. Deposition processes can be carried out with usual, comparatively inexpensive equipment at such pressures and temperatures.

To obtain the desired epitaxial growth, it is necessary to clean the monocrystalline silicon in the case of deposition from the vapor comprising chlorine as well as silicon, preferably through heating in an atmosphere comprising hydrogen. Cleaning of the wafer before selective deposition through heating in an atmosphere comprising hydrogen at a pressure of at least 1 atmosphere achieves that transistors can be formed with a satisfactory performance. This is not the case when the wafer is cleaned through heating in hydrogen at reduced pressure.

EP-A-430 280 describes a deposition process for selective deposition of silicon whereby the silicon is deposited from a vapor comprising chlorine and silicon at a reduced pressure, here 6.4 torr, and whereby the silicon wafer is cleaned by heating in hydrogen at a reduced pressure of 250 torr.

When the cleaning process is carried out at a reduced pressure, it is found, for example in the manufacture of a poly-emitter transistor, that the connection between the base zone and the layer of polycrystalline silicon is often not created. Upon investigation of the manufactured transistors it is found then that part of the layer of polycrystalline silicon immediately next to the window has disappeared. Said connection is found to be always created when cleaning is carried out at a pressure of at least 1 atmosphere, as in the method according to the invention.

It is assumed that, when the cleaning is carried out at reduced pressure, the hydrogen in which the wafer is heated during cleaning comprises comparatively much chlorine. This chlorine is capable of etching away said portion of the layer of polycrystalline silicon during cleaning of the wafer. The exposed monocrystalline silicon is then also attacked, though to a much lesser degree than the polycrystalline silicon. Since the cleaning and deposition are carried out in the same space, the lines and pumps connected to this space will be polluted with chlorine. Owing to the low pressure during cleaning, this chlorine can diffuse back into the space in which the cleaning is carried out. When cleaning is carried out at high pressure, as in the method according to the invention, this back diffusion is counteracted.

The method according to the invention can be carried out with comparatively simple equipment when the cleaning of the silicon slice is carried out at a pressure of 1 atmosphere. The atmosphere comprising hydrogen need not be compressed then. In addition, the risk of leaks is smaller when an atmosphere comprising hydrogen at atmospheric pressure is used than with the use of such an atmosphere at higher pressures.

Cleaning of the silicon wafer may be carried out, for example in an atmosphere with hydrogen and argon. Preferably, however, cleaning of the silicon wafer is carried out in an atmosphere comprising hydrogen only. Hydrogen can be obtained in a purer form than many other gases. The risk of introduction of impurities into the layer to be deposited is comparatively small when cleaning is carried out in hydrogen only. Preferably, cleaning is carried out at a temperature which lies in the range from 800° C. to 1,000° C.

BRIEF DESCRIPTION OF THE DRAWINGS

The invention will be explained in more detail below, by way of example, with reference to a drawing in which.

DETAILED DESCRIPTION OF THE PREFERRED EMBODIMENT

Figure 1:
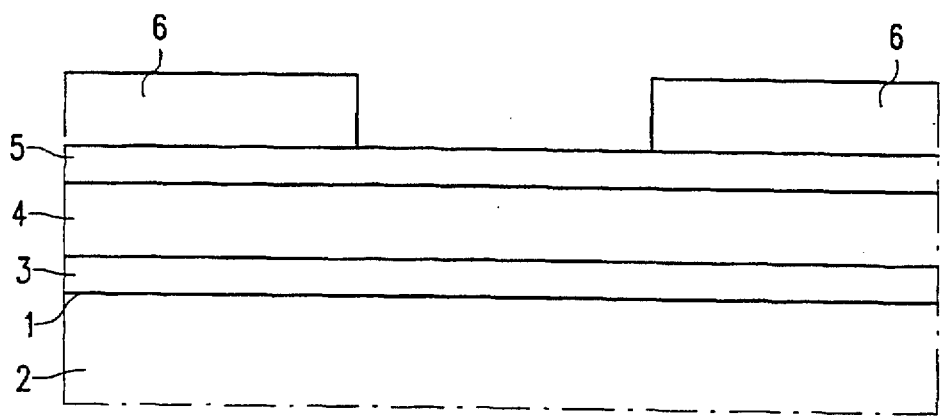
FIGS. 1 to 6 diagrammatically and in cross-section show a few stages in the manufacture of a poly-emitter transistor made by the method according to the invention.
Figure 2:
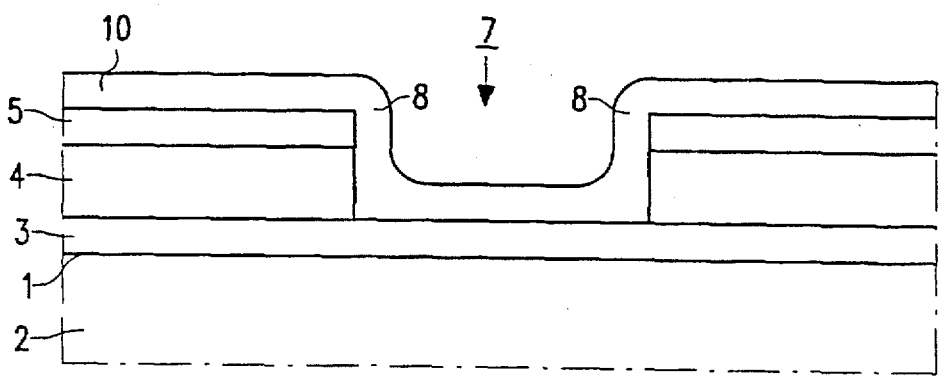
Figure 3:
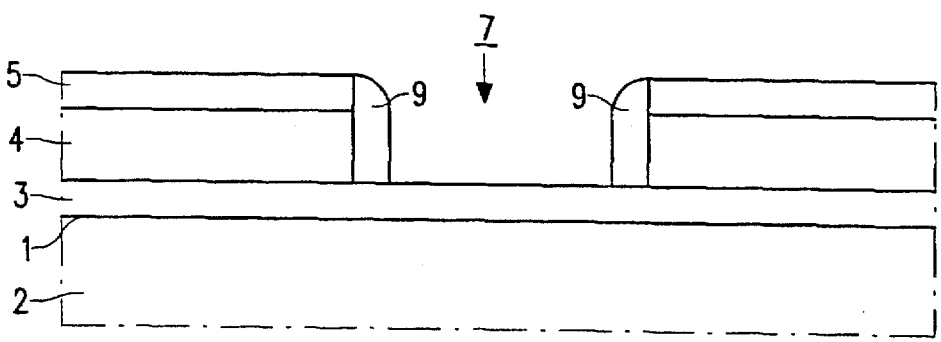
Figure 4:
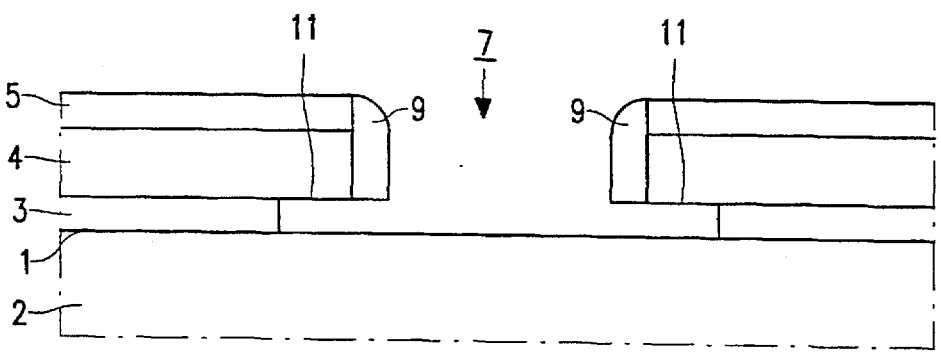
Figure 5:
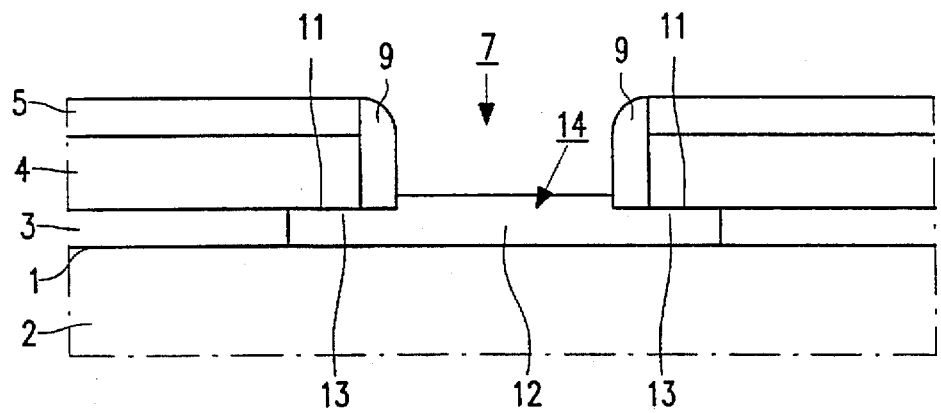
Figure 6:
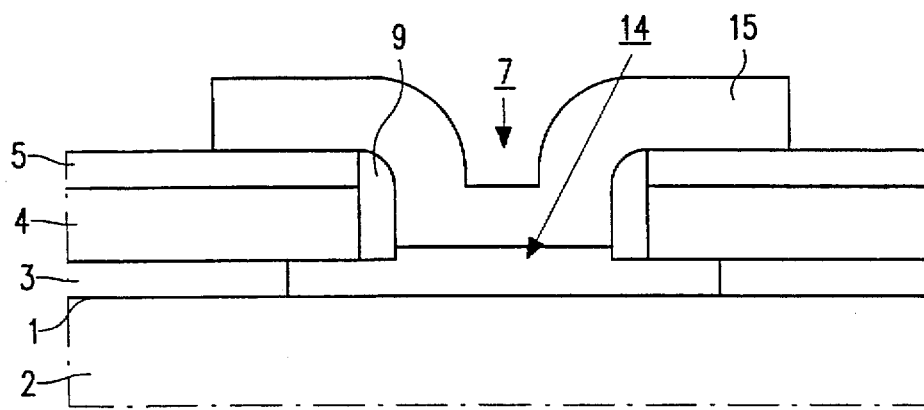

FIGS. 1 to 6 diagrammatically and in cross-section show a few stages in the manufacture of a semiconductor device, in this example a poly-emitter transistor, whereby a layer of insulating material 3, in the example an approximately 50 nm thick layer of silicon oxide, and an approximately 100 nm thick layer of polycrystalline silicon 4 are provided on a surface 1 of a monocrystalline silicon wafer 2 in a usual manner. In this example, an approximately 50 nm thick layer of silicon oxide 5 is also provided on the layer of polycrystalline silicon 4. A photoresist mask 6 is provided on the layer of silicon oxide 5. The layer of silicon oxide 5 and the layer of polycrystalline silicon 4 are subsequently provided with a window 7 by a usual etching treatment.

A protective layer 9 is then provided on the wall 8 of the window 7. In this example, an approximately 50 nm thick layer of silicon nitride 10 is deposited for this purpose on the layers of polycrystalline silicon 4 and silicon oxide 5 after the window 7 has been provided, whereupon the wafer is subjected to an anisotropic plasma etching treatment which is stopped when the layer of silicon oxide 5 next to the window 7 and the layer of silicon oxide 3 inside the window 7 are exposed.

After the protective layer 9 has been provided on the wall 8 of the window 7, the layer of silicon oxide 3 inside the window 7 and below an edge 11 of the polycrystalline layer 4 adjoining the window 7 is removed from the surface 1 of the silicon wafer 2.

Silicon is then selectively deposited at low pressure from a vapor onto the monocrystalline silicon of the semiconductor wafer 1 exposed next to the window 7 and onto the polycrystalline silicon of the layer 4. During deposition, the silicon 12 grows epitaxially in monocrystalline form on the exposed monocrystalline silicon of the wafer 2, whereas the silicon 13 grows in polycrystalline form on the polycrystalline silicon of layer 4 exposed next to the window. The grown monocrystalline silicon 12 forms a semiconductor zone 14 which forms a semiconductor junction together with the monocrystalline silicon of the wafer 2. This semiconductor zone 14 is connected to the layer of polycrystalline silicon 4 situated next to the window by the grown polycrystalline silicon 13. The semiconductor zone 14 forms the base zone of the transistor, the wafer 2 forms the collector of the transistor. The grown monocrystalline silicon 12 forms the collector-base junction together with the wafer 2.

After the selective silicon deposition, a further layer of polycrystalline silicon is deposited, which is provided with a desired doping and is etched into the pattern of the poly-emitter 15 after a heat treatment. This poly-emitter 15 forms the base-emitter junction together with the semiconductor zone 14 in the window 7. The required dopants for the base and emitter may be provided either after the deposition thereof in usual manner through ion implantation, or during the deposition thereof through the addition of dopants to the gas mixture from which the layers are deposited. The wafer may be provided with the required doping before the deposition of the layers of silicon oxide 3, polycrystalline silicon 4, and silicon oxide 5.

The method may also be used for manufacturing an MOS transistor (not shown). In that case a layer of gate dielectric is provided on the semiconductor zone 14 formed within the window 7, for example by oxidation. Then a further layer of polycrystalline silicon is again deposited which will form the gate electrode of the transistor.

According to the invention, the silicon 12, 13 is deposited from a vapor which comprises chlorine as well as silicon, while the silicon slice is cleaned before selective deposition through heating in hydrogen at a pressure of at least 1 atmosphere. Preferably, the deposition itself is carried out at a pressure which lies in the range from 1 to 100 torr, in which case it proceeds selectively. At such a pressure, the process can be carried out with usual, comparatively inexpensive equipment.

To obtain the desired epitaxial growth, it is necessary to clean the monocrystalline silicon, preferably through heating in hydrogen, if deposition takes place from a vapor comprising chlorine as well as silicon. Cleaning of the wafer before selective deposition through heating in hydrogen at a pressure of at least 1 atmosphere achieves that transistors with a satisfactory performance can be formed. This is not the case when the wafer is cleaned by heating in hydrogen at a reduced pressure.

Figure 7:
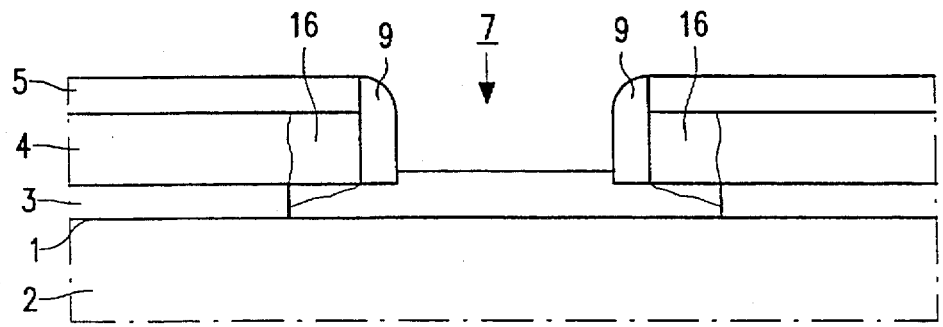
FIG. 7 shows the stage corresponding to FIG. 5, but with the cleaning of the silicon wafer being carried out at reduced pressure.

When cleaning is carried out at a reduced pressure of, for example, 100 torr, it is found that the connection between the semiconductor zone 14 and the layer of polycrystalline silicon 4 is often not created. It is found in that case that part of the layer of polycrystalline silicon 4 immediately next to the window 7 has disappeared, as shown in FIG. 7, so that a cavity 16 arises, this cavity 16 is not or only partly filled up during the deposition of silicon. When cleaning is carried out at a pressure of at least 1 atmosphere, as in the method according to the invention, this cavity is not formed. The connection is then definitely created.

It is suspected that the cavity 16 arises because the portion of the layer of polycrystalline silicon 4 immediately next to the window 7 is etched away by chlorine present in the space in which cleaning takes place. The cleaning and deposition are always carried out in the same space. The lines and pumps connected to this space will accordingly be polluted with chlorine after a number of depositions have been carried out. Owing to the low cleaning pressure, this chlorine can diffuse back into the space in which the cleaning is carried out. When cleaning is carried out at a pressure of at least 1 atmosphere, this back diffusion is counteracted.

The method may be carried out with comparatively simple equipment when cleaning of the silicon slice is carried out at a pressure of 1 atmosphere. The atmosphere comprising hydrogen need not be compressed then. Moreover, the risk of leaks is smaller with the use of an atmosphere comprising hydrogen at atmospheric pressure than with the use of such an atmosphere at higher pressures.

Cleaning of the silicon wafer may be carried out, for example, in an atmosphere of hydrogen and argon. Preferably, however, cleaning of the silicon wafer is carried out in an atmosphere comprising hydrogen only. Hydrogen can be obtained in a purer form than many other gases. The risk of introducing impurities into the layer to be deposited is comparatively small in that the cleaning is carried out in hydrogen only. Preferably, cleaning is carried out at a temperature which lies in the range from 800° C. to 1,000° C.

After cleaning in an atmosphere of hydrogen only at a temperature of 925° C., silicon can be selectively grown in that a gas mixture with 20 l hydrogen, 20 cc dichlorosilane, and 7 cc hydrochloric acid is conducted over the wafer heated to 700° C. Silicon will then grow at a rate of approximately 1.5 nm per minute. An alloy of silicon and 10% germanium can be grown in that a gas mixture of 20 l hydrogen, 20 cc dichlorosilane, 0.2 cc germanium, and 20 cc hydrochloric acid is conducted over the wafer heated to 700° C. The alloy will then grow at a rate of approximately 10 nm per minute.

What is claimed is:

1. A method of manufacturing a semiconductor device comprising the steps of:

providing a layer of insulating material and a layer of polycrystalline silicon on a surface of a monocrystalline silicon wafer, providing the layer of polycrystalline silicon with a window, providing a protective layer on the wall of said window, removing the layer of insulating material from the surface of the silicon wafer within the window and below an edge of the layer of polycrystalline silicon adjoining the window, cleaning the silicon wafer exposed in the window through heating in hydrogen, the cleaning carried out in a space having one or more conduits interfacing therewith for selective deposition of silicon within the window, inhibiting diffusion from the one or more conduits for selective deposition during the cleaning step by maintaining the pressure of the space of at least 1 atmosphere and selectively depositing silicon from a vapor at reduced pressure on the monocrystalline and polycrystalline silicon exposed in and adjacent the window, the silicon being deposited from a vapor comprising chlorine and silicon.

2. A method as claimed in claim 1, characterized in that the silicon wafer is cleaned by heating in an atmosphere comprising hydrogen at atmospheric pressure.

3. A method as claimed in claim 2, characterized in that the silicon wafer is cleaned through heating in an atmosphere comprising hydrogen only.

4. A method as claimed in claim 3, characterized in that the silicon wafer is cleaned in that it is heated in pure hydrogen at atmospheric pressure to a temperature which lies in a range from 800° C. to 1,000° C.

5. A method as claimed in claim 1, characterized in that the selective deposition is carried out at a pressure which lies in a range from 1 to 100 torr.

6. A method as claimed in claim 5, characterized in that the selective deposition is carried out at a temperature which lies in a range from 600 to 800° C.

7. A method as claimed in claim 5, characterized in that silicon is selectively deposited from a vapor of dichlorosilane and hydrogen.

8. A method as claimed in claim 7, characterized in that germanium is added to the vapor of dichlorosilane and hydrogen, so that an alloy of silicon and germanium is selectively deposited.

9. A method as claimed in claim 6, characterized in that silicon is selectively deposited from a vapor of dichlorosilane and hydrogen.

* * * * *